United States Patent [19]

Aiba et al.

[11] Patent Number: 5,183,846
[45] Date of Patent: Feb. 2, 1993

[54] SILICONE LADDER POLYMER COATING COMPOSITION

[75] Inventors: Yoshiko Aiba; Hiroshi Adachi; Etsushi Adachi, all of Hyogo, Japan

[73] Assignee: Mitsubishi Denki Kabushiki Kaisha, Tokyo, Japan

[21] Appl. No.: 722,476

[22] Filed: Jul. 2, 1991

[30] Foreign Application Priority Data

Jul. 3, 1990 [JP] Japan ................. 2-178027

[51] Int. Cl.$^5$ ............................ C08L 83/04
[52] U.S. Cl. .................. 524/865; 524/868; 528/10; 528/34; 528/43; 525/477
[58] Field of Search ............ 528/10, 34, 43; 525/477; 524/865, 828

[56] References Cited

U.S. PATENT DOCUMENTS

| | | | |
|---|---|---|---|
| 4,513,132 | 4/1985 | Shoji et al. | 528/43 |
| 4,657,843 | 4/1987 | Fukuyama et al. | 528/10 |
| 5,057,336 | 10/1991 | Adachi et al. | 528/10 |
| 5,102,967 | 4/1992 | Meder | 528/10 |

FOREIGN PATENT DOCUMENTS 55-94955 7/1980 Japan.
63-14749 4/1988 Japan.

*Primary Examiner*—Melvyn I. Marquis
*Attorney, Agent, or Firm*—Lowe, Price, LeBlanc & Becker

[57] ABSTRACT

Disclosed herein is a silicone ladder polymer coating composition containing silicone ladder polymer which is expressed in the following general formula:

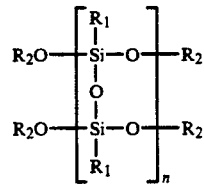

where $R_1$ represents the same or different types of phenyl groups or lower alkyl groups, $R_2$ represents the same or different types of hydrogen atoms or lower alkyl groups, and n represents an integer of 20 to 1000, an aromatic organic solvent which is so added that solid matter occupies 5 to 30 percent by weight, and a silane coupling agent of 150 to 3000 p.p.m. with respect to the polymer.

4 Claims, No Drawings

SILICONE LADDER POLYMER COATING COMPOSITION

BACKGROUND OF THE INVENTION

1. Field of the Invention

The present invention relates to a silicone ladder polymer coating composition.

2. Description of the Background Art

In recent years, the pattern of a highly integrated semiconductor device has been increasingly refined and densified. In order to form a passivation layer, a stress relaxation film or an insulating layer for a solid state component, a method of rotation-coating a polymeric material having smaller residual stress, superior smoothness and higher purity as compared with an inorganic material at 0.5 to 30 μm has been studied. Such a polymeric material is prepared from silicone ladder polymer or polyimide resin. When the silicone ladder polymer is applied to a passivation layer, a stress relaxation film or an insulating layer for a solid state component, it is necessary to rotation-coat a silicone ladder polymer solution onto a surface of a substrate of Si, Si-O, SiN or Al, dry the same, and finely work the as obtained polymer film for forming a ventilation part for upper and lower conductor layers and a through hole for connection with an external lead wire, and the like. Application of lithography is required for such a method. In a conceivable process, for example, a positive resist material of cresol novolak is applied onto the polymer film which has been rotation-coated and dried, and a prescribed pattern is formed on the resist film. Then the silicone ladder polymer film is etched and the resist film is removed, and heat curing is performed for film formation. In this case, the silicone ladder polymer film is etched and the resist film is removed in wet-type steps, and hence the silicone ladder polymer film is exposed to a developing solution for the resist material, a rinsing solution, an etching solution for the silicone ladder polymer film, a removing solution for the resist film, and the like. Japanese Patent Laying-Open No. 55-94955 (1980) and Japanese Patent Publication No. 63-14749 (1988) discloses silicone ladder polymer coating solutions.

When a silicone ladder polymer film which is formed of such a conventional polymer coating composition is finely worked by lithography, stress is applied to respective ones of two-layer polymer films upon dipping in solutions in respective steps, by solvent storaging or the like. Thus, the polymer films are easily separated from a substrate. This problem is particularly remarkable in a thick silicone ladder polymer film. Further, the conventional coating solution, which contains a hygroscopic polar solvent as well as a polymeric surface active agent, is so inferior in preservation stability that the as-formed film tends to be whitened.

SUMMARY OF THE INVENTION

An object of the present invention is to obtain a silicone polymer coating composition having an excellent film forming property and stability against moisture as well as superior preservation stability, which is not separated from a substrate upon exposure to a developing solution and a rinsing solution in wet-type steps.

The inventive silicone ladder polymer coating composition contains silicone ladder polymer expressed in the following general formula:

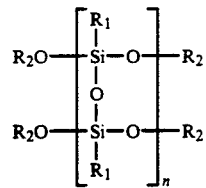

where $R_1$ represents the same or different types of phenyl groups or lower alkyl groups, $R_2$ represents the same or different types of hydrogen atoms or lower alkyl groups, and n represents an integer of 20 to 1000, an aromatic organic solvent which is so added that solid matter occupies 5 to 30 percent by weight, and a silane coupling agent of 150 to 3000 p.p.m. with respect to the polymer.

According to the present invention, the silane coupling agent is added in an appropriate amount so that the as-formed silicone ladder polymer film is not separated from a substrate and the film can be improved in adhesive property, while the aromatic organic solvent is adapted to improve a preservation property.

The silicone ladder polymer according to the present invention is expressed in the following general formula:

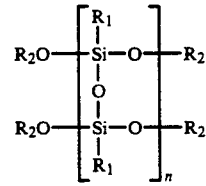

where $R_1$ represents the same or different types of phenyl groups or lower alkyl groups, $R_2$ represents the same or different types of hydrogen atoms or lower alkyl groups, and n represents an integer of 20 to 1000. For example, the silicone ladder polymer is prepared from at least one of polyphenylsilsesquioxane, polyphenylvinylsilsesquioxane, polyphenylmethylsilsesquioxane, polymethylvinylsilsesquioxane, polymethylsilsesquioxane, polyvinylsilsesquioxane and polyarylsilsesquioxane. The film forming property is deteriorated if the integer n in the above formula is less than 20, while the etching property of the as-formed film is deteriorated if the integer n exceeds 1000.

The aromatic organic solvent employed in the present invention is prepared from at least one of non-polar benzene, toluene, methoxybenzene, ethoxybenzene and orthodimethoxybenzene, while its density is appropriately determined in response to a required film thickness on the basis of molecular weight.

As to the silane coupling agent according to the present invention, it is preferable to avoid an amine material and a material having long organic straight chains, in consideration of heat resistance of the as-formed coating film and influence on a device. For example, the silane coupling agent is prepared from at least one of vinyltriethoxysilane, vinyltrimethoxysilane, β-(3,4 epoxycyclohexyl)ethyltrimethoxysilane, γ-glycidoxypropyltrimethoxysilane and γ-glycidoxypropylmethyldiethoxysilane. 150 to 3000 p.p.m. of such a silane coupling agent is added to the silicone ladder polymer. If the content is less than 150 p.p.m., it is impossible to attain the effect of the silane coupling agent, while the quality of the as-formed silicone ladder polymer film is deteriorated after heat curing/film formation if the content exceeds 3000 p.p.m.

The silicone ladder polymer is mixed with an aromatic organic solvent of non-polar benzene or alkoxybenzene, so that the silicone ladder polymer is in density of 5 to 30 percent by weight and has viscosity of 100 to 5000 cp. Such a silicone ladder polymer solution is applied onto a surface of a substrate of Si, Si-O, Si-N or Al by a rotation coating method or the like, dried, and then heat-cured at a temperature of at least 300° C., to form a film. Then a photoresist film is formed on the as-formed silicone ladder polymer film, and a patter of a photomask is transferred thereto through ultraviolet radiation. This film is dipped in a developing solution and a rinsing solution (pure water), thereby forming a resist pattern. The photoresist developing solution is not particularly restricted but may be prepared from a commercially available material. Then the as-obtained resist pattern is used as a mask to form an opening portion by dry etching, using an organic solvent. At this time, the substance is preferably rinsed with a poor solvent for the silicone polymer, in order to stop etching. Then the substance is dipped in a resist separating material to separate the resist film, thereby obtaining a silicone ladder polymer film to which the pattern is transferred. The pattern is transferred onto the silicone ladder polymer film through wet-type steps of formation of the resist pattern, etching and separation of the resist film. In experiment for the present invention, no deterioration of the adhesive property, such as separation of the silicone ladder polymer film from its substrate, was observed even if the periods for dipping the film in the solutions were increased to several times as compared with ordinary ones in the respective steps, the steps were repeated, or the steps were carried out in a multistage manner. Further, the coating solution was stably maintained transparent with no change of viscosity, even if the same was preserved at 40° C. for 1000 hours.

According to the present invention, it is possible to obtain a silicone ladder polymer coating composition having an excellent film forming property, stability against moisture, as well as superior preservation stability, which is not separated from a substrate upon exposure to a developing solution, a rinsing solution and the like in wet-type steps.

DESCRIPTION OF THE PREFERRED EMBODIMENTS

The present invention is now described in further detail on the basis of Examples, while it is to be noted that the present invention is not restricted to such Examples.

EXAMPLE 1

Silicone ladder polymer having mean molecular weight of 200,000, expressed in the following formula:

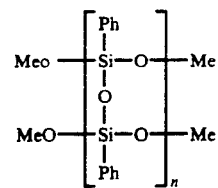

where Ph represents phenyl groups, was mixed with benzene, and a silane coupling agent of β-(3,4 epoxycyclohexyl)ethyltrimethoxysilane was added to the mixture by 1500 p.p.m. with respect to solid matter. This material was prepared to have density of 25% and viscosity of 5000 cp. This material was applied onto a surface of a substrate of Si, Si-O, Si-N or Al by rotation coating, and baked in a nitrogen atmosphere at 250° C. for 1 hour, to form a silicone ladder polymer film.

Then, a commercially available photoresist material of OFPR800 (trade name) by Tokyo Ohka Kogyo Co., Ltd. was employed to form a resist film of 2 μm in thickness, and a pattern of a photomask was transferred thereto through ultraviolet radiation. The material was dipped in a developing solution for OFPR (NMD-3) for 180 seconds, i.e., a period longer than the ordinary one of 60 seconds, and in a rinsing solution (pure water) for 180 seconds, i.e., a period longer than the ordinary one of 20 seconds, to form a resist pattern. It was confirmed by SEM that the silicone ladder polymer film was not separated from the substrate.

Then the as-obtained resist pattern was used as a mask, and the substance was dipped in an etching solution of benzene for 60 seconds and then in a rinsing solution of xylene for 30 seconds, to form an opening. It was confirmed by SEM that the silicone ladder polymer film was not separated from the substrate even if the steps were repeated.

Then the substance was dipped in a resist separating agent to separate the resist film, and it was again confirmed that the silicone ladder polymer film was not separated from the substrate even if the dipping time was increased and the step was repeated.

When no silane coupling agent was added, the silicone ladder polymer film was easily separated form the substrate in any of the aforementioned steps. Thus, it has been recognized possible to form a silicone ladder polymer film which is so improved in adhesion property that the same is not separated from a substrate, by adding an appropriate amount of silane coupling agent. The solution was stably maintained transparent with no change of viscosity even if the same was preserved at 40° C. for 1000 hours.

EXAMPLES 2 TO 20 AND COMPARATIVE EXAMPLES 1 TO 6

Table 1 shows silicone ladder polymer materials, solvents, polymer density values and silane coupling agents employed for forming samples of coating solutions, which were applied onto substrates for forming films in accordance with the method of Example 1. Table 1 also shows characteristics of the films, states of solutions after preservation at 40° C. for 1000 hours, and film states after excess wet-type steps in lithography processes. As to comparative examples 1 to 6, it was impossible to obtain good coating films.

TABLE 1

| | Type | Polymer Solvent | Concentration (%) | Substrate | Silane Coupling Agent | Content (ppm) | State of Solution after Preservation at 40° C. for 1000 h. | State of As-Formed Coating Film | Film State After Excess Wet-Type Steps |
|---|---|---|---|---|---|---|---|---|---|
| Example 2 | Double End Methoxypoly Phenyl-silsesquioxane | Benzene | 30 | Si Wafer | S1 | 1500 | Transparent with No Viscosity change | Homogeneous | Well-adhering |
| Example 3 | Double End Methoxypoly Phenyl-silsesquioxane | " | 30 | " | " | 300 | Transparent with No Viscosity change | " | Well-adhering |
| Example 4 | Double End Methoxypoly Phenyl-silsesquioxane | " | 30 | " | " | 3000 | Transparent with No Viscosity change | " | Well-adhering |
| Comparative Sample 1 | Double End Methoxypoly Phenyl-silsesquioxane | " | 30 | " | " | 100 | Transparent with No Viscosity change | " | Separated |
| Comparative Sample 2 | Double End Silanol-polyphenyl-silsesquioxane | " | 30 | " | " | 4000 | Transparent with No Viscosity change | Slightly Inferior | " |
| Example 5 | Double End Silanol-polyphenyl-vinyl-silsesquioxane | " | 25 | Al-clad Si Wafer | S2 | 300 | Transparent with No Viscosity change | Homogeneous | Well-adhering |
| Example 6 | Double End Silanol-polyphenyl-vinyl-silsesquioxane | Toluene | 25 | Al-clad Si Wafer | " | 1500 | Transparent with No Viscosity change | " | Well-adhering |
| Example 7 | Double End Silanol-polyphenyl-vinyl-silsesquioxane | " | 25 | Al-clad Si Wafer | " | 3000 | Transparent with No Viscosity change | " | Well-adhering |
| Comparative 3 | Double End Silanol-polyphenyl-vinyl-silsesquioxane | " | 25 | Al-clad Si Wafer | S3 | 100 | Transparent with No Viscosity change | " | Separated |
| Comparative 4 | Double End Ethoxy-polyphenyl-vinyl-silsesquioxane | " | 25 | Al-clad Si Wafer | S1 | 4000 | Transparent with No Viscosity change | Slightly Inferior | " |
| Example 8 | Double End Ethoxy-polymethyl-silsesquioxane | " | 25 | Al-clad Si Wafer | " | 300 | Transparent with No Viscosity change | Homogeneous | Well-adhering |
| Example 9 | Double End Ethoxy-polymethyl-silsesquioxane | " | 35 | Al-clad Si Wafer | " | 1500 | Transparent with No Viscosity change | " | Well-adhering |
| Example 10 | Double End Ethoxy-polymethyl-silsesquioxane | " | 35 | Al-clad Si Wafer | " | 3000 | Transparent with No Viscosity change | " | Well-adhering |
| Comparative Example 5 | Double End Ethoxy-polymethyl-silsesquioxane | Toluene | 35 | Si Wafer | S1 | 100 | Transparent with No Viscosity Change | Homogeneous | Separated |
| Comparative Example 6 | Double End Ethoxy-polymethyl-silsesquioxane | " | 35 | " | " | 4000 | Transparent with No Viscosity change | Slightly Inferior | Separated |
| Example 11 | Double End Siland-polymethyl-silsesquioxane | Methoxy-benzene | 30 | SiO2 Si Wafer | " | 1500 | Transparent with No Viscosity change | Homogeneous | Well-Adhering |
| Example 12 | Double End Siland-polymethyl-silsesquioxane | Methoxy-benzene | 30 | Si-N Si Wafer | " | 1500 | Transparent with No Viscosity change | " | Well-adhering |
| Example 13 | Double End Siland-polymethyl-silsesquioxane | Benzene | 30 | Al-clad Si Wafer | " | 1500 | Transparent with No Viscosity change | " | Well-adhering |
| Example | Double End | Toluene | 30 | Al-clad | " | 1500 | Transparent with No | " | Well- |

TABLE 1-continued

| | Type | Polymer Solvent | Concentration (%) | Substrate | Silane Coupling Agent | Content (ppm) | State of Solution after Preservation at 40° C. for 1000 h. | State of As-Formed Coating Film | Film State After Excess Wet-Type Steps |
|---|---|---|---|---|---|---|---|---|---|
| 14 | Methoxy-polyphenyl-silsesquioxanee | | | Si Wafer | | | Viscosity change | " | adhering |
| Example 15 | Double end Ethoxy-polyphenyl-silsequioxane | Ethoxy-benzene | 30 | Al-clad Si Wafer | " | 1500 | Transparent with No Viscosity change | " | Well-adhering |
| Example 16 | Double end Ethoxy-polyphenyl-silsequioxane | Orthodim ethoxy-benzene | 30 | Al-clad Si Wafer | " | 1500 | Transparent with No Viscosity change | " | Well-adhering |
| Example 17 | Double End Silanol-polyphenyl-silsesquioxane | Orthodim ethoxy-benzene | 30 | Al-clad Si Wafer | S3 | 1500 | Transparent with No Viscosity change | " | Well-adhering |
| Example 18 | Double End Silanol-polyphenyl-silsesquioxane | Orthodim ethoxy-benzene | 30 | Al-clad Si Wafer | S2 | 1500 | Transparent with No Viscosity change | " | Well-adhering |
| Example 19 | Double End Silanol-polyphenyl-silsesquioxane | Orthodim ethoxy-benzene | 30 | Al-clad Si Wafer | S1 | 1500 | Transparent with No Viscosity change | " | Well-adhering |
| Example 20 | Double End Silanol-polyphenyl-silsesquioxane | Orthodim ethoxy-benzene | 30 | Al-clad Si Wafer | S4 | 1500 | Transparent with No Viscosity change | " | Well-adhering |

S1: β-(3,4 epoxycyclohexyl) ethyltrimethoxysilane
S2: Vinyltrimethoxysilane
S3: vinyltriethoxysilane
S4: γ-glycidoxypropylmethyldiethoxysilane The present invention is not restricted to the above Examples but may be modified in various ways. Further, a coloring agent such as a dye or a pigment may be added to the inventive coating composition at need.

COMPARATIVE EXAMPLE 7

A coating solution was prepared under the same conditions as Example 1, except for that the solvent was prepared from hygroscopic N-methyl-2-pyrolidone. This coating solution was applied onto an Si wafer to form a film. This film was whitened.

COMPARATIVE EXAMPLE 8

A surface active agent prepared from copolymer of acrylic acid and ester methacrylate was added to the coating solution of Example 1 by 10 percent by weight with respect to the polymer. Although a coating film which was formed of this coating solution was in a good state, the surface active agent was deposited and whitened upon preservation at 40° C., while the film was separated from a substrate after excess wet-type steps in a lithography process.

What is claimed is:

1. A silicone ladder polymer coating composition containing a silicone ladder polymer of the following general formula:

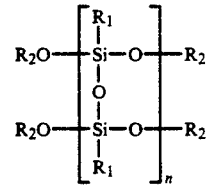

$R_1$ represents the same or different types of phenyl groups or lower alkyl groups, $R_2$ represents the same or different types of hydrogen atoms or lower alkyl groups, and n represents an integer of 20 to 1000, a nonpolar aromatic organic solvent being present in an amount such that solid matter occupies 5 to 30 percent by weight, and a silane coupling agent of 150 to 3000 p.p.m. with respect to said polymer, the silane coupling agent being selected from the group consisting of vinyltriethoxysilane, vinyltrimethoxysilane, β-(3,4 epoxycyclohexyl) ethyltrimethoxysilane, γ-glycidoxypropyltrimethoxysilane and γ-glycidoxypropylmethyldiethoxysilane.

2. A coating composition in accordance with claim 1, wherein said silicone ladder polymer is at least one element selected from the group consisting of polyphenylsilsesquioxane, polyphenylvinylsilsesquioxane, polyphenylmethylsilsesquioxane, polymethylvinylsilsesquioxane, polymethylsilsesquioxane, polyvinylsilsesquioxane and polyarylsilsesquioxane.

3. A coating composition in accordance with claim 1, wherein said aromatic organic solvent is at least one element selected from the group consisting of benzene, toluene, methoxybenzene, ethoxybenzene and orthodimethoxybenzene.

4. A coating composition in accordance with claim 1, having a viscosity of 100 to 5000 cp.

* * * * *